United States Patent [19]

Hsieh

[11] 4,287,485
[45] Sep. 1, 1981

[54] GAINASP/INP DOUBLE-HETEROSTRUCTURE LASERS

[75] Inventor: Jaw J. Hsieh, Burlington, Mass.

[73] Assignee: Massachusetts Institute of Technology, Cambridge, Mass.

[21] Appl. No.: 34,116

[22] Filed: Apr. 30, 1979

Related U.S. Application Data

[63] Continuation of Ser. No. 816,402, Jul. 18, 1977, abandoned, which is a continuation-in-part of Ser. No. 758,733, Jan. 12, 1977, abandoned.

[51] Int. Cl.³ ............................................. H01S 3/19
[52] U.S. Cl. .............................. 331/94.5 H; 357/16; 357/17
[58] Field of Search .............. 331/94.5 H; 357/16-18; 148/171, 175

[56] References Cited

U.S. PATENT DOCUMENTS

| | | | |
|---|---|---|---|
| 3,982,261 | 9/1976 | Antypas | 357/16 |
| 3,983,510 | 9/1976 | Hayashi et al. | 331/94.5 H |

OTHER PUBLICATIONS

T. P. Pearsall et al., "Efficient Lattice-Matched Double-Heterostructure LED's at 1.1 μm from $Ga_xI_{1-x}As_yP_{1-y}$", Applied Physics Letters, vol. 28, No. 9, 1 May 1976, pp. 499-501.
A. P. Bogatov et al., "Radiative Characteristics of In-P-GaInPAs Laser Heterostructures", Sov. Phys. Semicond., vol. 9, No. 10, pp. 1282-1285, Oct. 1975.
J. J. Hsieh, "Thickness and Surface Morphology of GaAs LPE Layers Grown by Supercooling . . . ", J. Cryst. Growth, vol. 27, 1974, pp. 49-61.
M. B. Parish, "Heterostructure Injection Lasers", Proceedings of the IEEE, vol. 64, No. 10, Oct. 1976, FIG. 28 of p. 1528.
K. Oe et al., "GaInAsP-InP Double Heterostructure Lasers Prepared by a New Apparatus", Japan J. Appl. Phys., vol. 15, (1976), No. 10, pp. 2003-2004.
J. J. Hsieh et al., "Room-Temperature cw Operation of GaInAsP/InP Double-Heterostructure Diod Lasers Emitting at 1.1 μm", Applied Physics Letters, vol. 28, No. 12, 15 Jun. 1976, pp. 709-711.

Primary Examiner—James W. Davie
Attorney, Agent, or Firm—Arthur A. Smith, Jr.; David E. Brook

[57] ABSTRACT

Double-heterostructure (DH) diode lasers based upon very thin epitaxial layers of $Ga_xIn_{1-x}As_yP_{1-y}$ grown on and lattice-matched to oriented InP substrates are disclosed. A preferred method for fabricating such lasers involves the successive growth, on an InP substrate, of an InP buffer layer, the GaInAsP active layer and an InP top barrier layer using liquid phase epitaxy techniques to grow these layers from supercooled solutions. Stripe geometry lasers can be fabricated from these materials which emit in the 1.1–1.3 μm range and are capable of cw operation for extended periods at room temperature.

12 Claims, 7 Drawing Figures

GAINASP/INP DOUBLE-HETEROSTRUCTURE LASERS

GOVERNMENT SUPPORT

The Government has rights in this invention pursuant to Contract No. AF19(628)-76-C-0002 awarded by the Department of the Air Force.

RELATED APPLICATIONS

This is a continuation of application Ser. No. 816,402, filed July 18, 1977, now abandoned, which is a continuation-in-part of Ser. No. 758,733, filed Jan. 12, 1977 now abandoned.

BACKGROUND OF THE INVENTION

1. Field of the Invention

This invention is in the field of semiconductor lasers and more particularly relates to GaInAsP/InP double-heterostructure (DH) lasers capable of pulsed and cw operation at room temperature.

2. Description of the Prior Art

Lasers capable of producing continuous stimulated radiation of frequencies in the vicinity of 1.1–1.3 μm at room temperature are of interest for communications systems using fiber optics, since it is in this frequency range that the transmission and dispersion losses in high-quality glass fibers are both low. Examples of such lasers which have previously been known include GaInAs, GaAsSb, and GaAlAsSb on GaAs substrates. Such prior art lasers, using either ternary or quaternary alloys with a binary substrate, have been able to operate continuously, but lattice-matching between the active layer and substrate has been difficult to achieve. To obtain acceptable lattice-matching, it has been necessary to fabricate these prior art lasers by growing either continuous or step-wise composition gradings on the binary substrates before deposition of the heterostructures. This complicated process results in these lasers being expensive, difficult to fabricate, and having poor reliability.

It has been recognized that lattice-matched heterojunctions could be formed from quaternary solid solutions of GaInAsP grown on InP substrates. Such lattice-matched single heterojunctions have been prepared with a bandgap energy range of 1.12–1.41 eV, and it is suggested by the same researchers that this range could be extended to 0.8–1.41 eV. See Antypas, G. A., Mon, R. L., "Growth and Characterization of InP-InAsAsP Lattice-Matched Heterojunctions," *J. Electrochem. Soc.: Solid State Science and Technology*, vol. 120, no. 11, Nov. 1973, pp. 1574–77.

A pulsed laser based upon GaInAsP/InP has also been described in *Sov. Phys. Semicond.*, Vol. 9, No. 10, pp. 1282–1285, Oct. 1975. This GaInAsP/InP laser is grown upon a (111) A InP substrate using an equilibrium cooling technique for growth of the layers in which a dummy InP substrate is used for equilibration of the growth solutions. Such a technique requires the preparation of two InP substrates for each run. It is also very difficult in this technique to control the thickness and composition of the GaInAsP active layer because layer thicknesses and compositions depend heavily upon the past history of growth. The minimum thickness achieved for the GaInAsP active layer using this technique is 1.2 μm. Reduction of $J_{th}$ is difficult because of the difficulty in controlling growth of the active layer to produce a uniform thin layer. The laser itself is reported as capable of being operated in the pulsed mode at room temperature and emits near the 1.11 μm range. However, the structure is not suitable for operation in the continuous mode; and moveover, the high threshold current density ($J_{th} > 10.4$ kA/cm$^2$) obtained in the pulsed mode of operation makes it impractical for commercial use.

The commercial GaAs/GaAlAs double-heterostructure lasers and other known ternary and quaternary double-heterostructure lasers have not been widely accepted for use in areas such as optical communication for a number of reasons. The most important ones have been expense of manufacture and unreliability in use. Previously fabricated GaInAsP/InP lasers have been incapable of continuous wave (cw) operation at room temperature. Even in the pulsed mode, such lasers have undersirably high threshold current densities. Because of this, there has been a great need, therefore, for an improved double-heterostructure diode laser which overcomes these problems.

SUMMARY OF THE INVENTION

This invention relates to double-heterostructure diode lasers based upon ultra thin epitaxial layers of GaInAsP grown upon InP substrates. The active layer of GaInAsP has a thickness of about 1.2 μm or less, and preferably below 0.5 μm for lasers which are to be operated in a continuous wave mode. An InP barrier layer is also grown over the thin epitaxial layer of GaInAsP, and ohmic contacts are applied to both surfaces. Typically, a buffer layer of GaInAsP is applied to the substrate prior to growth of the active layer to eliminate surface defects in the substrate surface of the type caused by thermal etching, etc.

The GaInAsP/InP laser of this invention is preferably made by using a prepared InP substrate of (111)B or (100) orientation. Supercooling liquid phase epitaxy (LPE) growth techniques can be used to grow, on said substrate, a buffer layer of InP, an active layer of GaInAsP, and a top barrier layer of InP. Stripe geometry configurations can be fabricated from the broad area devices and these are particularly suitable for continuous wave operation.

Contrary to some prior LPE teachings in the literature, the growth parameters, such as the composition of the solution, the amount of the GaInAsP solution supercooling, and the orientation of the substrate have to be carefully controlled for reproducible and uniform thin active layer growth.

In the supercooling growth technique of this invention, a source substrate is not required. The composition of each growth solution can be predetermined before layer growth and the amount of solution supercooling can be exactly controlled. This makes the growth of one layer independent of the growth of other layers.

The diode lasers produced are highly uniform, reproducible and reliable. Room-temperature life tests on some GaInAsP lasers of this invention under cw operation show that the lasers do not show any noticeable sign of degradation after thousands of hours of operation. This result is quite startling in view of prior art lasers made from different material systems. For example, DH GaAs/GaAlAs lasers usually show about 50% failure in the first 1000 hours of cw operation. The DH GaAsSb and GaInAs lasers have lifetimes of only about twenty and two hours, respectively, under similar operating conditions.

In addition, the emission wavelength of the GaInAsP/InP double-heterostructure diode lasers described herein can be controlled in the range of about 0.95-1.70 μm at room temperature without significantly detracting from good lattice-matching by simply changing the composition of the quaternary solid solution of GaInAsP. Since this range includes 1.1-1.3 μm, the region currently thought to be optimum for optical communication systems utilizing fused silica fibers, these lasers are prime candidates for use in such systems.

DESCRIPTION OF PREFERRED EMBODIMENTS

Figure 5:
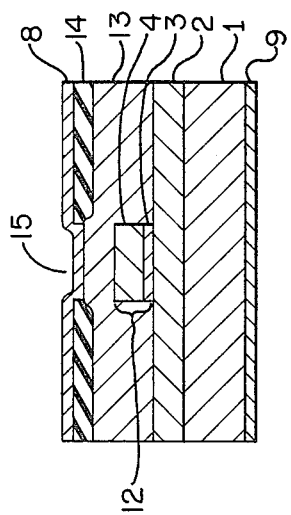
FIG. 5 is a cross-sectional view of an oxide-defined buried stripe diode laser of this invention.

The GaInAsP/InP heterostructures of this invention are grown on oriented InP substrates using supercooling liquid-phase epitaxial (LPE) techniques which have been described for growth of binary compounds. A thorough discussion of the growth of gallium arsenide liquid phase epitaxial (LPE) layers on gallium arsenide substrates by supercooling, step-cooling, equilibrium-cooling and two-phase solution techniques is presented in Hsieh, J. J., "Thickness and Surface Morphology of GaAs LPE Layers Grown by Supercooling, Step-Cooling, Equilibrium-Cooling and Two-Phase Solution Techniques," *J. Cryst. Growth* 27, 49-61 (1974). The teachings of this reference, particularly in regard to supercooling LPE growth techniques, are hereby incorporated by reference.

In general, the supercooling technique involves the formation of an equilibrium mixture of the composition to be deposited followed by cooling to a point between the equilibrium temperature and precipitation temperature (temperature at which a homogeneous precipitate occurs). Typically, the solutions are supercooled from about 0.1° C. to about 15° C. below the equilibrium temperature. At this point, the substrate is introduced and deposition of the desired composition occurs.

In the case of binary compound growth, the composition of the deposited layer is the same as the substrate and a lattice-match between the substrate and the compound is achieved automatically, regardless of the composition of the solution, the amount of supercooling, and the orientation of the substrate. However, in growing GaInAsP layers on InP substrates, the composition of the active layer has been found to be a sensitive function of the growth parameters including: the composition of solution, the amount of supercooling, and the orientation of the substrate. Each of these parameters is important in determining the composition and layer thickness of the deposited active GaInAsP layer so that a lattice-match with the InP substrate and layer thickness control are obtained for a desired emission wavelength. Close control of these parameters is necessary in order to obtain reproducible, lattice-matched layers of the quality required for such devices such as diode lasers and photocathodes. This finding is in sharp contrast with the observation of Stringfellow that the composition of GaInP layers grown on GaAs substrates remained constant over an appreciable range of liquid compositions. Stringfellow, G. B., *J. Appl. Phys.* 43, 3455 (1972).

The degree to which the required control has been accomplished by this invention is indicated by the following typical results. The average peak emission wavelength 11,328 Å of five randomly selected stripe-geometry double-heterostructure GaInAsP/InP lasers made from a single wafer with active region composition of $Ga_{0.11}In_{0.89}As_{0.30}P_{0.70}$ have deviations of $-11$, 21, 11, 11 and $-32$ Å. The wavelength variation is $\pm 0.22\%$ and the total variation of 53 Å is comparable to the wavelength spread of the modes for each diode, which ranges from 30 to 50 Å. The peak emission wavelengths for $Ga_{0.16}In_{0.84}As_{0.40}P_{0.60}$ diodes made from layers prepared in five different runs under nominally the same growth conditions deviate from the average 11,471 Å wavelength by $-32$, 21, $-71$, 77 and 5 Å. The wavelength variation is $\pm 0.65\%$, and the total variation, 148 Å, is again comparable to the total mode spacing, which ranges from 100 to 150 Å.

The substrates used were n-type oriented wafers ($n \approx 2 \times 10^{18} cm^{-3}$) cut from Sn-doped Czochralski-grown crystals. The substrate surfaces were ground with 2-μm alumina, chemi-mech polished with Br—CH$_3$OH, and then free etched with Br—CH$_3$OH to remove an additional 10 μm. Three layers were grown sequentially on the substrate: an n-type InP layer (Sn-doped, $n \approx 4 \times 10^{18} cm^{-3}$), an n-type $Ga_xIn_{1-x}As_yP_{1-y}$ active region layer (either undoped or Sn-doped, $n \approx 1-3 \times 10^{17} cm^{-3}$), and a p-type InP top barrier layer (Zn-doped, $p \approx 3 \times 10^{18} cm^{-3}$). All layers were grown using the supercooling LPE technique which uses a horizontal sliding boat of high-purity graphite and all were grown at a cooling rate of 0.7° C./min. from In-rich solutions that were typically supercooled by 0.1°-10° C. below their saturation temperatures near 635° C.

Figure 1:
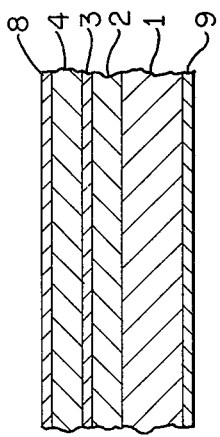
FIG. 1 is a cross-sectional view of a broad-area diode laser of this invention.

FIG. 1 illustrates the resulting double-heterojunction structure with ohmic contacts thereon. Layer 1 is the InP substrate, layer 2 is the buffer InP layer, layer 3 is the active GaInAsP layer and layer 4 is the InP barrier layer. Ohmic contacts 8 and 9 are subsequently applied by art-recognized techniques, and might comprise, for example, Au/Zn and Au/Sn metallic layers, respectively. The supercooling technique yields smooth flat layers of uniform thickness. Typically, active layer 3 of GaInAsP might be about 0.5 μm thick whereas InP buffer layer 2 and InP barrier layer 4 might be about 2 μm thick.

In the preparation of the growth solutions, precisely weighed amounts of In, InP and dopants were introduced into the first and third solution wells of a sliding boat for the growth of the InP buffer and top layers. In, InP, GaAs, InAs and dopants were put into the second solution well for growth of the GaInAsP active layer. In, InP, GaAs and InAs were used because they provided a convenient means of establishing appropriate atomic percentages of In, P, As and Ga in solution. Different mixtures could, of course, be used to obtain the same percentages, and, for that matter, equilibrium mixtures could be formed using entirely different techniques.

The boat loaded with the above charge, and the substrate, were inserted into the growth tube and heated to 10°-20° C. above the highest equilibrium temperature of the growth solutions for about 30 mins. The boat was then cooled down to the growth temperature for the first and subsequent layer growth at a cooling rate of about 0.7° C./min. The amount of supercooling for the first and third In-P solutions was about 10° C.; therefore, the growth temperature for the first and third InP layers was about 10° C. below equilibrium temperature for these solutions. The amount of supercooling for the GaInAsP solution was between 0.1°-15° C., and was determined by the precise amount of charges added to the In-rich solutions. Although, the growth procedures are familiar to those skilled in the art of supercooling LPE growth of binary compounds, dependence of the composition and layer thickness of the GaInAsP quaternary upon the composition of the growth solution, the amount of supercooling of the solution, and the orientation of the substrates, is not believed to be apparent to those skilled in the art from the results obtained in the binary compound growth previously described.

The active layer could be grown directly on an InP substrate if its surface was suitable. Usually, however, direct growth of the active layer on the substrate is not preferred because some decomposition of the substrate occurs by preferential evaporation of P during the heating period before LPE growth. Better heterostructures can usually be obtained by first depositing an InP buffer layer and then growing the GaInAsP layer before significant decomposition can occur.

Orientation of the InP substrates used was substantially (111)B or (100). It was found that exact orientation was not critical and could be as much as five degrees off the axis of orientation without significantly affecting laser performance. Substrates were also used which were cut from a Zn-doped ingot (P=$4\times10^{18}$cm$^{-3}$) grown from a stoichiometric melt by the horizontal gradient-freeze technique. No substantial effect was produced by substrates produced by the different techniques. It is possible, of course, to grow active layers of GaInAsP on InP substrates having any orientation.

For pulsed operation, the substrate wafer was processed as follows. After being removed from the LPE growth furnace, the wafer was ground on the substrate side to reduce its overall thickness to about 100 $\mu$m. Ohmic contacts, 8 and 9, were applied to the as-grown p-type InP top surface and to the n-type InP substrate, respectively. These were applied by evaporating Au/Zn and Au/Sn, respectively, and alloying at 360°-400° C. The wafer was then cleaved and sawed to form diodes with Fabry-Perot cavities. The room-temperature spectrum of a DH diode with an active region about 0.6 $\mu$m thick, measured at a current density about 10% above the laser threshold ($J_{th}$) showed the radiation concentrated almost entirely in a single peak at 1.105 $\mu$m. The lowest value of $J_{th}$ obtained was 1.5 kA/cm$^2$, which was measured for a diode with active layer of 0.4 $\mu$m thickness and a cavity length (L) of 475 $\mu$m. Typically, $J_{th}$ was between 2 to 4 kA/cm$^2$.

For continuous operation at room temperature, the broad area laser structure of FIG. 1 was further processed into stripe-geometry to form narrow active regions. Initially, stripe-geometry lasers were fabricated by a proton bombardment technique well-known to those skilled in the art and similar to the one used in preparing prior art GaAs/GaAlAs lasers of this type. The as-grown surface of the top InP layer was plated with 25-$\mu$m-wide Au stripes on 250-$\mu$m centers, after which this surface was bombarded with a $2\times10^{15}$cm$^{-2}$ dose of 180 keV protons. While the areas beneath the Au stripes were shielded from the protons and therefore unaffected by the bombardment, the unprotected areas were rendered highly resistive to a depth of about 1.8 $\mu$m, approximately the thickness of the top InP layer. As a result of this treatment, the current was confined to the narrow regions that had remained low in resistance during diode operation.

After bombardment, the Au stripes were etched off, and the wafer was lapped on the substrate side to a thickness of 100 $\mu$m. Contacts were made by evaporating Au/Zn($\sim$10 wt%Zn) and Au/Sn($\sim$20 wt%Sn) onto the p- and n-type sides of the wafer, respectively, and alloying by means of a 10-sec 360° C. drive-in cycle. The wafer was then cleaved into bars and sawed between adjacent stripes to obtain individual diodes. A number of diodes found to have pulsed laser thresholds of 6 kA/cm$^2$ or less were also operated at cw. Each of these devices was mounted on a copper stud embedded in a large copper block, through which methanol flowed continuously to help maintain temperature stability.

Figure 2:
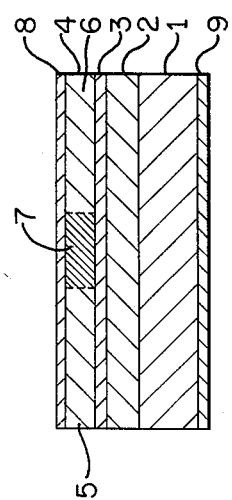
FIG. 2 is a cross-sectional view of a proton-defined stripe diode laser of this invention.

A cross-sectional view of the proton-defined stripe (PDS) laser is shown in FIG. 2. The upper p-type InP layer 4, after the selective exposure to protons, has two high resistivity regions 5, 6 on either side of the p-type region 7. The Au-Zn layer 8 and the Au-Sn layer 9 form the ohmic contacts to the diode. The current produced by forward biasing of the diode is essentially confined to the region 7 as is the radiation produced by the diode.

Figure 3:
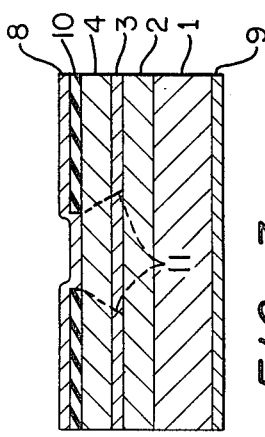
FIG. 3 is a cross-sectional view of an oxide-defined stripe diode laser of this invention.

Continuous operation might also be accomplished using oxide-defined stripes (ODS) to limit the region of diode current flow. The as-grown surface of InP layer 4 was coated with a layer 10 of SiO$_2$, etched to provide 25 $\mu$m wide openings to layer 4 on 250 $\mu$m centers, and then metallized to form ohmic contact layers 8 and 9. The remaining steps to form the individual diodes were as described for the PDS lasers. Diode performance was essentially the same as with proton-defined stripes and diode current was confined to the region 11 shown with dashed lines in FIG. 3.

Figure 4:
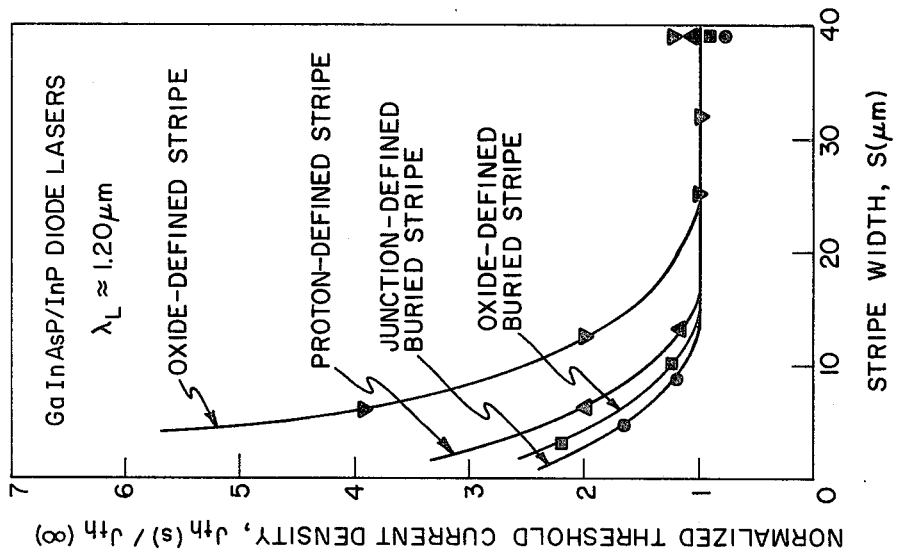
FIG. 4 is a plot of normalized threshold current density as a function of stripe width for stripe diode lasers of this invention.

For efficient coupling of a diode laser to an optical fiber, the width of the laser active region should be matched to the diameter of the fiber core, which is only about 5 $\mu$m for some single-mode fibers. For proton-defined stripe (PDS) and oxide-defined stripe (ODS) devices, the variation of pulsed threshold current density, $J_{th}$, with stripe width, s, is shown in FIG. 4 where the ratio of $J_{th}$(s) to the threshold current for broad-area devices from the same wafer, $J_{th}(\infty)$, is plotted as a function of s. Each data point gives the lowest $J_{th}(s)/J_{th}(\infty)$ obtained in experiments on a number of lasers of the same type. As s decreases below about 15 $\mu$m, $J_{th}$ for PDS lasers increases rapidly due to lateral spreading of the injected carriers and the radiation from the sides of the stripe. In addition to the spreading from the active layer, ODS lasers show even larger lateral spreading from the top InP layer ($\sim$3 $\mu$m thick), as shown by the rapid increase of $J_{th}$ for s<25 $\mu$m.

To reduce lateral spreading, two types of buried-stripe lasers have been fabricated in which the GaInAsP active region is entirely surrounded by InP, thereby providing lateral as well as vertical carrier and optical confinement. For the prior-art GaAs/GaAlAs buried-stripe DH lasers, similar buried-stripe confinement has produced a marked reduction in total threshold current.

The GaInAsP/InP buried-stripe lasers are fabricated from double-heterostructures prepared by liquid-phase-epitaxial growth using supercooled solutions as described earlier. The final p-InP layer was about 2 μm thick for junction-defined buried stripe (JDBS) lasers, and was about 0.5 μm thick for oxide-defined buried stripe (ODBS) lasers. In principle, ODBS lasers could be made without a top InP layer 4, but a thin layer is found to be preferable in order to protect the GaInAsP active layer 3 against chemical and thermal attack during the fabrication process. Etched mesas 12 are formed by deposition of protective $SiO_2$ stripes (not shown in FIG. 5) over the mesas followed by selective etching with HCl and then $3H_2SO_4:H_2O:H_2O_2$ to remove the upper InP layer 4 and the GaInAsP layer 3, respectively, from the unprotected areas not under the $SiO_2$ stripes.

To prepare ODBS lasers as in FIG. 5, the $SiO_2$ stripes were removed with HF, and a layer 13 of p-InP was grown over the whole substrate wafer. The wafer was then coated with a layer 14 of $SiO_2$, which was etched to open window 15 aligned with the GaInAsP stripes 3 for making contact to the diodes.

Figure 6:
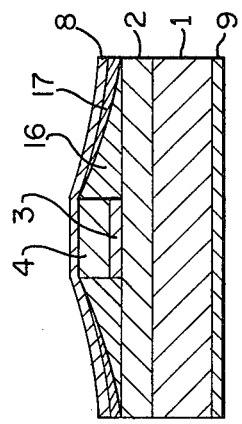
FIG. 6 is a cross-sectional view of a junction-defined buried stripe diode laser of this invention.

To fabricate JDBS lasers as in FIG. 6, successive layers 16 and 17 of p-InP and n-InP were grown without removing the $SiO_2$ stripes from the mesas. The remaining fabrication steps were the same for both types of devices: the $SiO_2$ stripes were removed with HF, the wafer thickness was reduced to 50–100 μm by lapping the substrate side, Au/Sn and Au/Zn contacts were evaporated on the n- and p-type sides, respectively, and finally the wafer was cleaved and sawed into individual lasers, as shown in FIGS. 5 and 6.

The variation of the pulsed threshold current density with stripe width for the two types of buried-stripe lasers as shown in FIG. 4. The relative increase in $J_{th}$ with decreasing width is less for the ODBS than for the PDS devices, and is still less for the JDBS lasers. For the latter, the increase over $J_{th}(\infty)$ is only 15% for s=10 μm and only 65% for s=5 μm. The small difference between the two types of buried-layer devices is probably due to a difference in the thickness of the regrown InP layers, which affects the amount of leakage current that flows through the InP homojunctions instead of through the GaInAsP stripe.

Room-temperature cw operation of typical JDBS lasers of $Ga_{0.22}In_{0.78}As_{0.47}P_{0.53}$ and $Ga_{0.20}In_{0.80}As_{0.48}P_{0.52}$ on (100) substrates at wavelengths of 1.208 and 1.246 μm has been achieved for devices that have been indium-soldered to a copper heat sink through which methanol was circulated to keep the temperature at 24° C. The lasers emitting at the 1.246 μm wavelength were fabricated with the grown layer soldered to the heat sink, and the cw $J_{th}$ was about 40% higher than the pulsed value for the same device. The lasers emitting at 1.208 μm had the substrate side soldered to the heat sink, which was ~50 μm from the active region. The lowest cw threshold obtained for these devices was 105 mA for s=10 μm (corresponding to $J_{th}$=5.3 kA/cm$^2$), only about 25% higher than the pulsed value. Although the ratio of cw to pulsed threshold depends strongly upon soldering technique, these results indicate that the heat dissipation of the GaInAsP/InP buried-stripe lasers was comparable for the two soldered configurations. Placing the substrate side in contact with the heat sink should reduce the heat dissipation and light extraction problems in future integrated optics applications.

For the ODBS lasers, only the pulsed mode operation was attempted. Those lasers had an active layer typically of the composition $Ga_{0.16}In_{0.84}As_{0.50}P_{0.50}$ and thickness of ~0.4 μm on a (111)B substrate with an emission wavelength of 1.279 μm. The threshold current density of those devices was low enough to demonstrate that cw operation could be obtained if proper heat sinking was provided.

Figure 7:
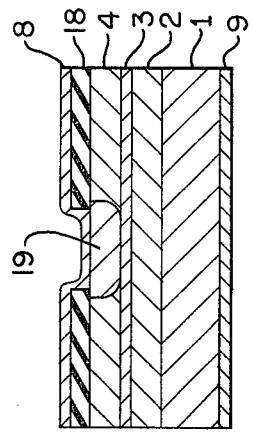
FIG. 7 is a cross-sectional view of a Zn-diffused stripe diode laser of this invention.

To reduce and simplify the device fabrication process and at the same time still achieve cw operation capability of the lasers, the Zn-diffused stripe (DS) lasers of FIG. 7 have been developed. To fabricate the DS lasers, the Dh GaInAsP/InP structure was first grown as for broad-area lasers except, in this case, the top InP layer was doped with n-type impurity which is the same type as the substrate instead of the opposite type as in the previous examples. Active layer 3 can be either n-type, p-type or nondoped. The top layer 4 was then coated with phosphorous glass 18, which was etched to leave stripes for Zn diffusion. The wafer along with Zn and P were vacuum-sealed in a quartz tube and diffused at 500° C. for about 90 min. The Zn which was diffused in the top InP layer on the stripe converted the n-type InP into p-type at region 19.

As is well known to those in the diffusion art, the depth of penetration of the p-type region 19 depends upon the surface concentration of the Zn at region 19 relative to the concentration of impurities in the active layer 3 and the barrier layers 2 and 4. The impurity concentration in the barrier layer 4 is relatively low ($10^{17}$cm$^{-3}$ or less) compared to the surface concentration of the Zn(~$10^{18}$cm$^{-3}$ at 500° C.) so region 19 penetrates layer 4. If the layer 3 impurity concentration is n-type and is higher than $10^{18}$cm$^{-3}$, the Zn will diffuse at a much slower rate at the interface of layers 3 and 4; otherwise the Zn will penetrate to layer 2. Depending on the concentration of layer 2 and the diffusion time, the Zn diffusion front can either be stopped at the layer 2 and 3 interface or penetrate into the layer 2 region.

After diffusion, the substrate side of the wafer was lapped down to about 100 μm thick. Au/Sn and Au/Zn contacts were evaporated onto the substrate and diffusion sides, respectively, without etching the glass off. The glass can be etched off and the Au/Zn contact can be deposited on the top InP surface directly if the active layer is grown with p-type impurity doping.

For those lasers with the Zn diffusion front stopped at the layer 2 and layer 3 interface, the current confining capability was similar to PDS lasers but the fabrication processes are much simpler and controllable. Room-temperature cw operations of those lasers has been achieved with an emission wavelength of 1.24 μm with 18 μm stripe width at 350 mA threshold current. Because of its simplicity in processing into stripe-geometry lasers, it is believed that the Zn-diffused stripe laser could find wide application in the future for integrated optics applications.

In the preferred embodiments described earlier in this application, the substrate thickness used was about 50 to 100 μm. It should be understood that the minimum thickness of the substrate is desired for good heat conduction from the active layer through the substrate to the heat sink when the substrate is soldered to a heat sink. Handling problems limit the minimum acceptable substrate thickness.

For the stripe geometry lasers, the stripe width can vary widely depending upon the particular application. In general, it is preferred to have stripes of about 25 μm or less for lasers intended for continuous operation.

While the particular embodiments of the invention specifically discussed above seem preferable at the present time, modification thereto may occur to those skilled in the art without departing from the spirit and scope of the invention. For example, although the discussion herein has been in terms of liquid phase epitaxy (LPE) techniques, it is also believed that suitable active layers could be formed using other deposition techniques, such as vapor phase epitaxy (VPE), molecular beam epitaxy (MBE), etc. Additionally, whereas the substrates specifically enumerated herein have been n-type InP, it is clear that the substrates could be p-type, in which case the top layer would be n-type. Also, additional quaternary or other layers can be present in the devices described herein in addition to those layers specifically enumerated. Hence, the invention is not to be construed as limited to the particular embodiments shown and described herein. These are many equivalents to these specific embodiments, and such equivalents are intended to be covered by the following claims.

What is claimed is:

1. In a diode laser, the improvement wherein the diode comprises:
    a. InP substrate;
    b. a buffer layer of InP on said substrate;
    c. an active layer of $Ga_xIn_{1-x}As_yP_{1-y}$ on said buffer InP layer, said active layer being substantially lattice-matched to said buffer layer and said active layer having a thickness of less than about 0.5 μm;
    d. a barrier layer of InP on said active $Ga_xIn_{1-x}As_yP_{1-y}$ layer; and,
    e. first and second ohmic contacts to said substrate and said barrier layer.

2. The improvement of claim 1 wherein said substrate and said buffer layer are of one conductivity type, said active layer is of either conductivity type, and said upper layer of said InP is of a different conductivity type from that of the substrate and buffer layer.

3. The improvement of claim 2 wherein said substrate and said buffer layer are n-type semiconductors and said barrier layer of InP is a p-type semiconductor.

4. The improvement of claim 2 wherein said substrate and said buffer layer are p-type semiconductors, and said barrier layer is an n-type semiconductor layer.

5. The improvement of claim 2 wherein said substrate has a substantially (111B) or (100) orientation.

6. The improvement of claim 5 wherein said buffer layer is sufficient to smooth pits on the surface of the substrate.

7. The improvement of claim 1 additionally including means for confining current flow through the active layer to a stripe.

8. The improvement of claim 7 wherein said substrate and said buffer layer are n-type semiconductors and said barrier layer of InP is a p-type semiconductor layer.

9. The improvement of claim 8 wherein said means for confining current flow through the active layer to a stripe comprises regions of said barrier layer of InP doped with protons to make said regions relatively non-conductive.

10. The improvement of claim 7 wherein said means for confining current flow through the active layer to a stripe comprises a layer of silicon dioxide confining said stripe.

11. The improvement of claim 7 wherein said means for confining current flow through the active layer to a strip comprises zinc-diffused stripes.

12. A double-heterostructure device comprising an InP substrate, an epitaxial active layer of $Ga_xIn_{1-x}As_yP_{1-y}$ lattice-matched to said InP substrate and having a thickness of less than about 0.5 μm, and a barrier layer of InP.

* * * * *

UNITED STATES PATENT AND TRADEMARK OFFICE
CERTIFICATE OF CORRECTION

PATENT NO. : 4,287,485
DATED : September 1, 1981
INVENTOR(S) : Jaw J. Hsieh

It is certified that error appears in the above—identified patent and that said Letters Patent is hereby corrected as shown below:

Column 2, line 30, delete "a buffer layer of GaInAsP" and insert therefor ---a buffer layer of InP---.

Signed and Sealed this

Nineteenth Day of October 1982

[SEAL]

Attest:

GERALD J. MOSSINGHOFF

Attesting Officer

Commissioner of Patents and Trademarks